United States Patent
Joshi et al.

(10) Patent No.: US 7,180,818 B2
(45) Date of Patent: Feb. 20, 2007

(54) HIGH PERFORMANCE REGISTER FILE WITH BOOTSTRAPPED STORAGE SUPPLY AND METHOD OF READING DATA THEREFROM

(75) Inventors: Rajiv V. Joshi, Yorktown Heights, NY (US); Azeez Bhavnagarwala, Newton, CT (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 10/996,311

(22) Filed: Nov. 22, 2004

(65) Prior Publication Data

US 2006/0109733 A1    May 25, 2006

(51) Int. Cl.
*G11C 8/00*    (2006.01)
(52) U.S. Cl. ............. 365/230.05; 365/226; 365/185.23
(58) Field of Classification Search ................ 365/154, 365/230.05, 226, 185.23, 189.09
See application file for complete search history.

(56) References Cited

U.S. PATENT DOCUMENTS

| | | | | |
|---|---|---|---|---|
| 6,075,741 A | * | 6/2000 | Ma et al. | 365/226 |
| 6,549,465 B2 | * | 4/2003 | Hirano et al. | 365/185.23 |
| 6,597,624 B2 | * | 7/2003 | Aritomi | 365/230.06 |
| 6,671,201 B2 | * | 12/2003 | Masuda | 365/154 |
| 2004/0090818 A1 | * | 5/2004 | Liaw | 365/154 |

* cited by examiner

*Primary Examiner*—Richard Elms
*Assistant Examiner*—Dang Nguyen
(74) *Attorney, Agent, or Firm*—Law Office of Charles W. Peterson, Jr.; Louis J. Percello, Esq.; Rafael Perez-Pineiro, Esq.

(57) ABSTRACT

A multi-port register file, integrated circuit (IC) chip including one or more multi-port register files and method of reading data from the multi-port register file. The supply to storage latches in multi-port register file is selectively bootstrapped above the supply voltage during accesses.

39 Claims, 3 Drawing Sheets

HIGH PERFORMANCE REGISTER FILE WITH BOOTSTRAPPED STORAGE SUPPLY AND METHOD OF READING DATA THEREFROM

FIELD OF THE INVENTION

The present invention is related to multi-port registers and more particularly improving multi-port register file performance.

BACKGROUND DESCRIPTION

Register files or, simply, registers are well known small, fast local storage arrays. A typical n by m register file includes storage latches in n rows and is m wide, e.g., a single byte, word or multi-word. Register files include, for example, first in first out (FIFO) or serial shift registers and first in last out (FILO) or push/pop registers. A FIFO may be a circulating shift register, for example, or a multi-port register with at least one input port and at least one output port. Additionally, typical such multi-port registers may be used for improving processor performance, e.g., in processor data queues or as pipeline registers.

In a state of the art pipeline structure, synchronous logic is segmented with a pipeline between segments or stages. So, in a pipeline processor, for example, a processor clock clocks pipeline registers distributed at strategic locations throughout the processor logic. Ideally, data latched in one pipeline stage propagates to, and arrives at, the next stage just as it is clocked into that next stage. So, pipeline registers act as boundaries between data units traversing the pipeline stages. Thus, for an N segment pipeline, N data units may be traversing the pipeline with one data unit in each segment. Also ideally, the logic delay through the N stages is N clock periods, i.e., the time each data unit spends in the pipeline is no more than necessary to propagate through the logic. So, ideal registers do not add path delay that detracts from overall performance.

In practice however, registers add to path delay, regardless of the register type (FIFO or FILO) or its use, e.g., whether as local storage or as a pipeline boundary. Consequently, for a pipeline circuit for example, the clock period limits the depth of the logic between pipeline registers to less than the clock cycle for any given clock frequency. Instead, the propagation delay between registers is offset or reduced by the register delay, where the register delay is the time through the registers, i.e., the time in and out of a register. So, the register delays reduce the time available for logic for each stage.

Further, the register delay is additive because it is encountered at each stage. For a pipeline circuit with 10 pipeline stages, for example, the 10 additional register delays may add one or more clock cycles to the time each data unit requires to traverse the pipeline, which is also known as the latency. Typically designers reduce the logic between stages with a corresponding increase in the overall number of stages to accommodate for these register delays. Each additional stage increases the circuit complexity without adding to the chip function; while it consumes valuable circuit area or real estate and so, reduces logic density. Further, each additional stage increases chip power, again without adding to the function and so, reduces chip efficiency. Of course, these problems dissipate as the register delays are reduced relative to other path logic.

Thus, there is a need for improved register performance.

SUMMARY OF THE INVENTION

It is a purpose of the invention to improve register performance;

It is another purpose of the invention to reduce register delays;

It is yet another purpose of the invention to reduce pipeline path latency.

The present invention relates to a multi-port register file, integrated circuit (IC) chip including one or more multi-port register files and method of reading data from the multi-port register file. The supply to storage latches in multi-port register file is selectively bootstrapped above the supply voltage during accesses, e.g., with a high K dielectric bootstrap capacitor.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
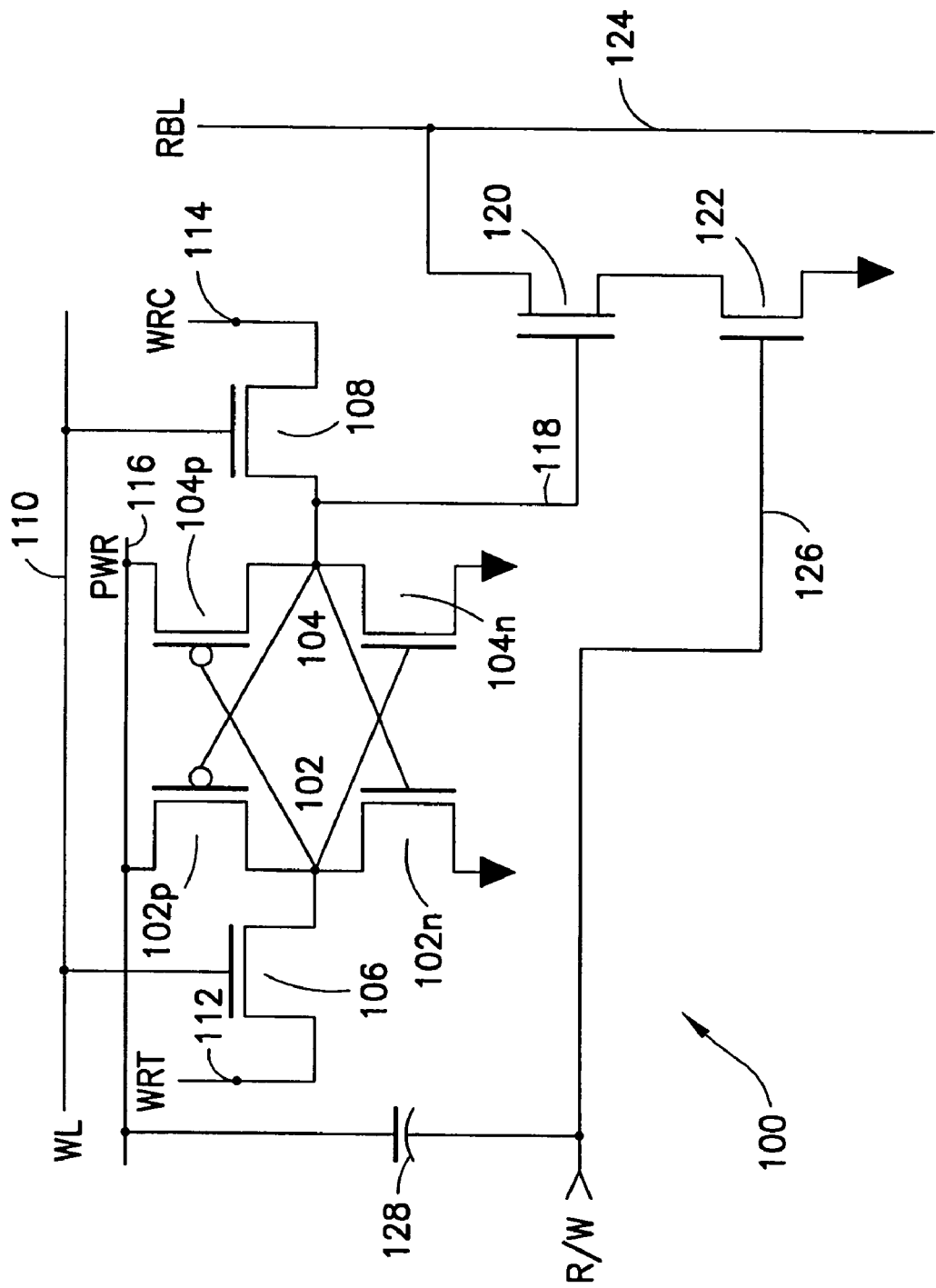
FIG. 1A shows an example of a preferred two port storage register latch with a bootstrapped supply, such a may be included in a high performance N by M register file according to a preferred embodiment of the present invention.

Turning now to the drawings and, more particularly, FIG. 1 shows an example of a preferred multi-port register cell 100 with a bootstrapped supply such as may be included in a high performance N by M multi-port register file according to a preferred embodiment of the present invention. The multi-port register cell 100 is a two port storage register latch in this example that, preferably, is in the insulated gate technology known as CMOS. The register cell 100 includes a pair of cross-coupled inverters 102, 104. A pair of write pass gate field effect transistors (FETs) 106, 108 are connected to the cross-coupled inverters 102, 104. A word-select line 110 is connected to the gates of write pass gate FETs 106, 108, which are connected between the cross-coupled inverters 102, 104 and a pair of complementary write lines, a write true (WRT) 112 and a write complement (WRC) 114. The cross-coupled inverters 102, 104, each include a p-type FET (PFET) 102p, 104p and an n-type FET (NFET) 102n, 104n and are connected between a word supply 116 and a supply return or register ground. Output 118 from one of the cross-coupled inverters (104 in the example) is connected to the gate of one of a pair of series connected NFETs 120, 122. The series connected NFETs 120, 122 are connected between ground (which need not be register ground) and a read data output line 124. A read-select line 126 is connected to the gate of the other of the series connected NFETs 120, 122. Thus, the cell contents 118 and the read-select line 126 are NANDed at read-data output line 124. A capacitor 128, preferably interline coupling capacitance, couples the read-select line 126 to the word supply 116. For additional or enhanced bootstrap capacitance, optionally, capacitor 128 may be a high K dielectric capacitor, e.g., with a high K dielectric material passivating the read-select line 126 to the word supply 116 wiring layer. Also, capacitor 128 may include an individually formed capacitor (e.g., an FET capacitor or conductive plates or alternating wiring layers) between each read-select line 126 and word supply 116.

Writing the register cell 100 begins with placing the intended data value on the pair of complementary bit write lines 112, 114, driving one high and the other low. Then, the word-select line 110 is driven high, which turns on the pass gate FETs 106, 108. Turning on the pass gate FETs 106, 108 couples the pair of complementary bit write lines 112, 114 to the cross-coupled inverters 102, 104. A single bit of data is transferred to the cross-coupled inverters 102, 104. Then, the word-select line 110 is returned low, which turns off the pass gate FETs 106, 108, latching the data in the cross-coupled inverters 102, 104.

Prior to reading data, however, the read-select line 126 is low and word supply 116 is at normal supply voltage, i.e., at $V_{dd}$. So, the full array supply voltage is applied to bootstrap capacitor 128, i.e., it is fully charged to $V_{dd}$. The read-data output line 124 is pre-charged high and may then be allowed to float. The stored data may be read out by driving the read-select line 126 high, which is NANDed with the contents of the cell, i.e., at the output 118 of inverter 104. So, with the read-select line 126 high, if output 118 is high, the read-data output line 124 is pulled low; or, otherwise, remains high. In addition however, the bootstrap capacitor 128 bootstraps the word supply 116 above $V_{dd}$, i.e., to $V_{dd}+\delta$. The difference voltage is primarily a function of the ratio of bootstrap capacitance at bootstrap capacitor 128 and the apparent capacitance of the supply line 116, which includes direct and indirect (e.g., through on cross-coupled inverter PFETs 102P or 104P) cell capacitances. As noted hereinabove, in addition to line to line coupling capacitance, bootstrap capacitor 128 may include a space capacitor (e.g., an area capacitor of two plates on adjacent wiring layer or an FET capacitor) specifically added to enhance bootstrap capacitance. If cell contents internal node 118 is high, bootstrapping the supply voltage 116 facilitates switching the read-data output line 124, because $V_{dd}+\delta$ is passed to the gate of NFET 120, increasing the drive to switch the read-data output line 124.

Figure 1B:
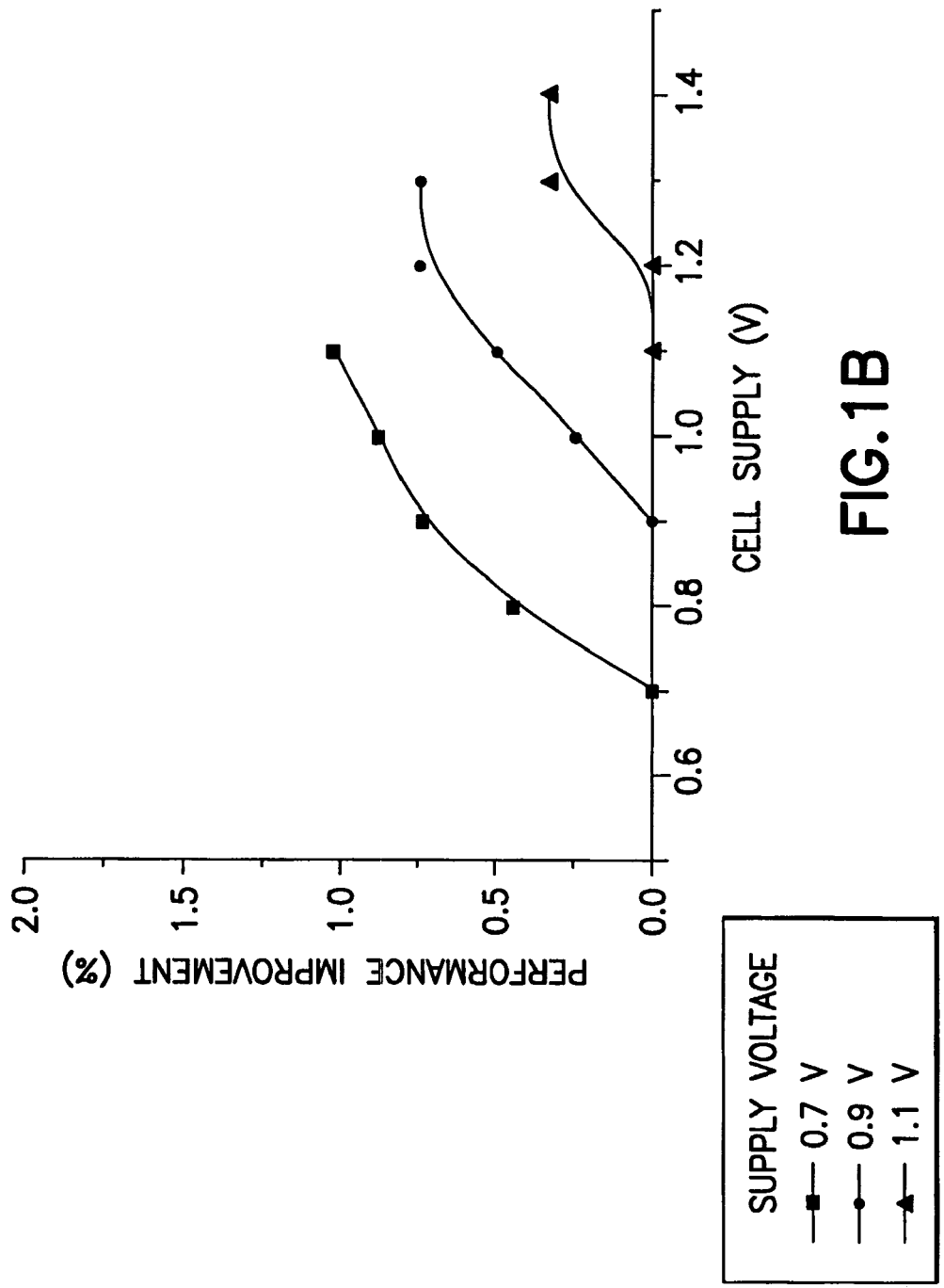
FIG. 1B shows comparison of boosting cell supply voltage from three base supply voltages, 0.7V, 0.9V and 1.1V verses performance improvement for a typical register file cell.

FIG. 1B shows a comparison of boosting cell supply voltage from three base supply voltages, 0.7V, 0.9V and 1.1V at each of 130, 132 and 134 respectively, verses performance improvement for a typical register file cell, e.g., 100 in FIG. 1A. Thus, performance improvement may be realized by boosting cell supply in each of the examples 130, 132, 134 until an upper limit is reached, when the read performance improvement essentially plateaus, e.g., the added output transition time offsets the additional drive to a single FET (120) of the two NANDed devices 120, 122.

Figure 2:
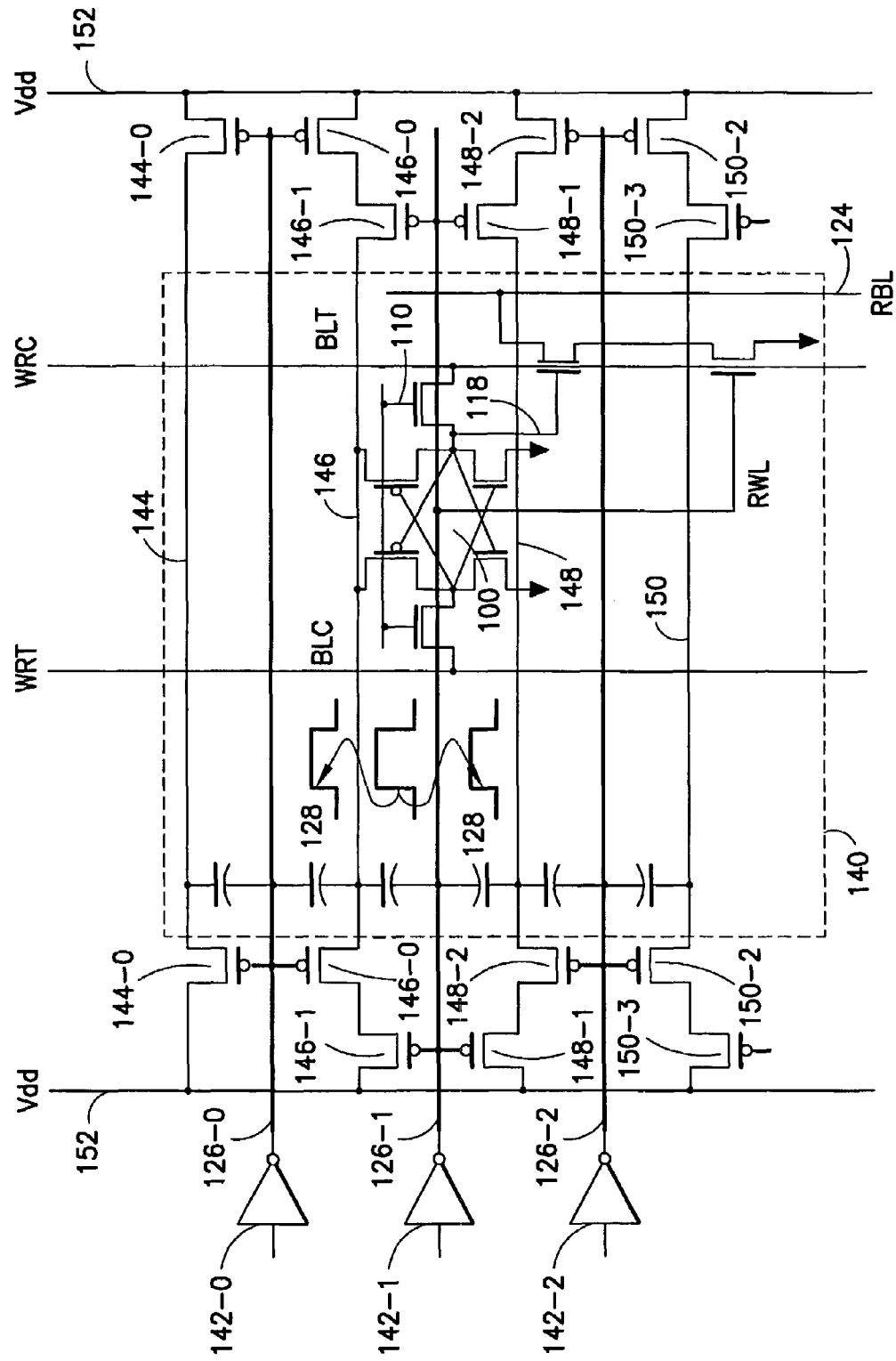
FIG. 2 shows an example of a cross section of a preferred embodiment high performance N by M register file of preferred embodiment cells.

FIG. 2 shows an example of a cross section of a preferred embodiment high performance N by M register file 140 of preferred embodiment cells, e.g., two port storage register latches 100 of FIG. 1A. In this example, 3 read word lines 126-0, 126-1, 126-2, of N words or rows are shown, with a single two port storage register latch 100 being shown in a single bit of one word, 126-1. A typical row driver 142-0, 142-1, 142-2 drives a corresponding read word line 126-0, 126-1, 126-2. Each of the N read word lines 126-0, 126-1, 126-2 are capacitively coupled to adjacent shared row supply lines 144, 146, 148, 150, which are shared in this example by cells connected to adjacent read word lines 126-0, 126-1, 126-2. Preferably, this capacitive coupling is from physical placement of the read word lines 126-0, 126-1, 126-2 interleaved with the shared row supply lines 144, 146, 148, 150, analogous to what is shown graphically in this FIG. 2. Thus, for example, the read word lines 126-0, 126-1, 126-2 and shared row supply lines 144, 146, 148, 150 may be physically located on a common chip layer at minimum pitch and organized substantially as shown. Each row supply line 144, 146, 148, 150 includes at least one switch 144-0, 146-0, 146-1, 148-1, 148-2, 150-2, 150-3 and etc., connected between the respective row supply line 144, 146, 148, 150 and an ungated supply line 152, e.g., register array or chip supply $V_{dd}$. In this example, except at boundary cells connected to boundary supply lines, e.g., 126-1, switches 144-0, 146-0, 146-1, 148-1, 148-2, 150-2, 150-3 are pairs of series connected PFETs in each end of the respective row supply line 144, 146, 148, 150. Each read word line 126-0, 126-1, 126-2 also gates off and on (opens and closes) the PFET switches 144-0, 146-0, 146-1, 148-1, 148-2, 150-2, 150-3 and etc. So, when a read word line, e.g., 126-1, is high, the corresponding row supply lines 146, 148 are decoupled from the array supply 152 because one of each respective pair is open, e.g., PFETs 146-1, 148-1 are off.

Data is written by placing the intended contents on complementary bit write pairs 112, 114 in FIG. 1A (i.e., driving one high and the other low) and driving a word select-line 110 high. Once data is written into the selected register location, the word-select line 1110 is dropped. A read is selected by driving low one input to the corresponding row driver, e.g., to 142-1. In response to the low on the input, the selected row driver 142-1 drives the corresponding read word line 126-1 high, which opens the row supply switches, i.e., turns off the connected pair PFETs 146-1, 148-1. With the switches 146-1, 148-1 open, the row supply lines 146, 148 are decoupled from the ungated supply 154. Simultaneously, charge across the bootstrap capacitance 128 couples the signal from the read word line 126-1 to the row supply lines 146, 148, bootstrapping them above $V_{dd}$. The higher cell contents 118 are NANDed with read word line 126-1. However, the higher bootstrap voltage is passed to 118, which causes read bit line 124 to switch faster than it would normally switch, i.e., unbootstrapped. Thereafter, the input to the row driver 142-1 is raised which drops the corresponding read word line 126-1, closing the switches 146-1, 148-1 in the row supply lines 146, 148 and reconnecting the row supply lines 146, 148 to the ungated supply 154. Thus, read performance is improved for each selected word, improving array performance.

Advantageously, bootstrapping the rows supply lines in the register, increases the read biases for improved storage register read time. Therefore, fewer pipeline stages are required for the same logic in a preferred embodiment pipeline. Thus, circuit and chip efficiency is improved and chip latency is reduced.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:
1. A storage array comprising:
   an array of storage latches arranged in rows and columns;
   an array supply supplying power to said array;
   a row power supply at each row coupled to said array supply;

a plurality of word lines, each of said word lines selecting a corresponding row of said storage latches and decoupling a corresponding said row power supply from said array supply; and a row selector selectively driving each of said plurality of word lines, drive from each selectively driven word line being coupled to said corresponding row power supply, said corresponding row power supply being coupled above said array supply.

2. A storage array as in claim 1, further comprising:

at least one supply switch between said array supply and said corresponding row power supply, said corresponding row power supply being supplied through said at least one supply switch.

3. A storage array as in claim 2, wherein each said corresponding row is supplied by a pair of row supply lines, a word line driving said each corresponding row coupling drive to both of said pair of row supply lines.

4. A storage array as in claim 3, wherein adjacent said rows each share a corresponding one of said pair of row supply lines.

5. A storage array as in claim 4, wherein half of said storage latches in each of said adjacent rows are connected to each shared said corresponding one of said pair of row supply lines.

6. A storage array as in claim 5, wherein at least one supply switch is two supply switches, each being switched by an adjacent word line.

7. A storage array as in claim 5, wherein at least one supply switch is two supply switches at each end of said row supply line, one each being switched by an adjacent word line.

8. A storage array as in claim 7, wherein said array is a CMOS multi-port register file and said supply switches are p-type field effect transistors (PFETs).

9. A storage array as in claim 1, wherein each of said storage latches is a two port storage register latch.

10. A storage array as in claim 9, wherein each said storage latch in said CMOS multi-port register file comprises a pair of series connected NFETs connected between a cell read output and ground, one of said series connected NFETs being gated by said storage latch and a second of said series connected NFETs being gated by one of said word lines.

11. A storage array as in claim 10, wherein each said storage latch further comprises:

a pair of cross-coupled inverters connected between one said row power supply and ground; and a pair of n-type field effect transistor (NFET) pass gates gated by a write word line, each pass gate connected to an output of one of said pair of cross-coupled inverters.

12. A storage array as in claim 1, further comprising:

a bootstrap capacitor between each of said word lines and a corresponding said array supply, said bootstrap capacitor coupling drive from said selectively driven word line to said corresponding row power supply.

13. An integrated circuit (IC) chip comprising:

a multi-port storage array including a plurality of storage latches arranged in rows and columns;

an array supply supplying power to said multi-port storage array;

a plurality of word lines, each of said plurality of word lines selecting a row of said storage latches;

a row supply at each row supplying power to said each row;

at least one supply switch between said array supply and said row supply at said each row, power being supplied to said row supply through said at least one supply switch, a corresponding one of said plurality of word lines selectively opening each said at least one supply switch; and a row selector selectively driving each one of said plurality of word lines, said each one capacitively coupling a corresponding said row power supply above said array supply.

14. An IC as in claim 13, wherein said each row is supplied by a pair of row supply lines, said drive from said each one coupling both of said pair above said array supply.

15. An IC as in claim 14, wherein adjacent said rows share a corresponding one of a pair of said row supply lines.

16. An IC as in claim 15, wherein half of said two port storage latches in each of said adjacent rows are connected to each shared said corresponding one of said pair of row supply lines.

17. An IC as in claim 16, wherein at least one supply switch is at least two supply switches, each being switched by an adjacent word line.

18. An IC as in claim 17, wherein at least two supply switch is two supply switches at each end of said row supply line, one each being switched by an adjacent word line.

19. An IC as in claim 18, wherein said IC is a CMOS IC and said supply switches are p-type field effect transistors (PFETs).

20. An IC as in claim 19, further comprising:

a bootstrap capacitor between each of said word lines and a corresponding said array supply, said bootstrap capacitor coupling drive from said selectively driven word line to said corresponding row power supply.

21. An IC as in claim 20, wherein each said storage latch is a two port storage register latch comprising a pair of series connected NFETs connected between a cell read output and ground, one of said series connected NFETs being gated by cell contents and a second of said series connected NFETs being gated by said storage latch one of said word lines.

22. An IC as in claim 21, wherein each said two port storage register latch further comprises:

a pair of cross-coupled inverters connected between one said row supply line and ground; and a pair of n-type field effect transistor (NFET) pass gates gated by a write word line, each pass gate connected to an output of one of said pair of cross-coupled inverters.

23. A CMOS integrated circuit (IC) chip including one or more multi-port register files, each multi-port register file comprising:

a multi-port storage array including a plurality of storage latches arranged in rows and columns;

an array supply supplying power to said multi-port storage array;

a plurality of word lines, each of said plurality of word lines selecting a row of said storage latches;

a plurality of row supply lines interleaved with and running parallel to said plurality of word lines, each of said plurality of word lines being capacitively coupled to at least one row supply line at a corresponding said row of latches, said corresponding row of latches receiving power from each coupled said at least one row supply line;

at least one supply switch between said array supply and said each coupled at least one row supply line and, each supply switch being selectively opened by a corresponding one of said plurality of word lines; and a row selector selectively driving each one of said plurality of word lines, drive to said each one capacitively coupling each corresponding said at least one row supply line above said array supply.

24. A CMOS IC chip as in claim 23, wherein each of said plurality of word lines is capacitively coupled to two of said plurality of row supply lines and each said corresponding row of latches is supplied by a pair of row supply lines, said drive to said each one coupling both above said array supply.

25. A CMOS IC chip as in claim 24, wherein at least one supply switch is at least two supply switches.

26. A CMOS IC chip as in claim 24, wherein adjacent said rows share a corresponding one of said two of said plurality of row supply lines.

27. A CMOS IC chip as in claim 26, wherein half of said storage latches in each of said adjacent rows are connected to each said corresponding one of said two of said plurality of row supply lines.

28. A CMOS IC chip as in claim 27, wherein at least two supply switches is two supply switches at each end of said row supply line, one each being switched by an adjacent word line.

29. A CMOS IC chip as in claim 28, wherein supply switches are p-type field effect transistors (PFETs), said CMOS IC further comprising:
   a bootstrap capacitor between each of said word lines and a corresponding said array supply, said bootstrap capacitor coupling drive from said selectively driven word line to said corresponding row power supply.

30. A CMOS IC chip as in claim 29, wherein each said storage latch is a two port storage register latch comprising a pair of series connected NFETs connected between a cell read output and ground, one of said series connected NFETs being gated by said storage latch and a second of said series connected NFETs being gated by one of said word lines.

31. A CMOS IC chip as in claim 30, wherein each said two port storage register latch further comprises:
   a pair of cross-coupled inverters connected between one said row supply line and ground; and
   a pair of n-type field effect transistor (NFET) pass gates gated by a write word lines, each pass gate connected to an output of one of said pair of cross-coupled inverters.

32. A CMOS IC chip as in claim 23 further comprising:
   a high K dielectric between interleaved said row supply lines and said plurality of word lines.

33. A method of reading data from a storage may, said storage array arranged in rows and columns, said method comprising the steps of:
   a) selectively uncoupling a row supply line from an array supply;
   b) capacitively coupling voltage on said uncoupled row supply line above an array supply voltage; and
   c) sensing a data signal developing on one or more read data lines.

34. A method of reading data as in claim 33, wherein the step (a) of selectively uncoupling comprises floating said row supply line.

35. A method of reading data as in claim 34, wherein floating said row supply line in step (a) comprises opening switches connecting said row supply line to said array supply.

36. A method of reading data as in claim 35 further comprising:
   d) closing said switches, said row supply line being reconnected to said array supply and returning to said array supply voltage.

37. A method of reading data as in claim 36, wherein said storage array is a multi-port register and said switches are FETs gated by a corresponding read row line.

38. A method of reading data as in claim 37, wherein said row supply line is floated in step (a) coincident with gating said FETs off.

39. A method of reading data as in claim 37, wherein said multi-port register is a two port register.

* * * * *